United States Patent
Hsu et al.

(10) Patent No.: US 11,355,642 B2
(45) Date of Patent: Jun. 7, 2022

(54) METHOD FOR MANUFACTURING SEMICONDUCTOR STRUCTURE

(71) Applicant: Taiwan Semiconductor Manufacturing Co., Ltd., Hsinchu (TW)

(72) Inventors: Ju-Wang Hsu, Taipei (TW); Chih-Yuan Ting, Taipei (TW); Tang-Xuan Zhong, Kaohsiung (TW); Yi-Nien Su, Hsinchu (TW); Jang-Shiang Tsai, Zhubei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/657,035

(22) Filed: Oct. 18, 2019

(65) Prior Publication Data
US 2020/0052122 A1    Feb. 13, 2020

Related U.S. Application Data

(62) Division of application No. 14/582,576, filed on Dec. 24, 2014, now Pat. No. 10,483,397, which is a division of application No. 11/744,896, filed on May 7, 2007, now Pat. No. 8,927,353.

(51) Int. Cl.
| | |
|---|---|
| *H01L 21/00* | (2006.01) |
| *H01L 21/84* | (2006.01) |
| *H01L 29/78* | (2006.01) |
| *H01L 29/66* | (2006.01) |
| *H01L 29/06* | (2006.01) |

(52) U.S. Cl.
CPC ...... *H01L 29/7851* (2013.01); *H01L 29/0649* (2013.01); *H01L 29/66795* (2013.01); *H01L 29/7853* (2013.01)

(58) Field of Classification Search
CPC .......... H01L 29/0649; H01L 29/66795; H01L 29/7851; H01L 29/7853
See application file for complete search history.

(56) References Cited

U.S. PATENT DOCUMENTS

| | | | |
|---|---|---|---|
| 6,706,571 B1 | 3/2004 | Yu et al. | |
| 6,812,119 B1 | 11/2004 | Ahmed et al. | |
| 6,858,478 B2 | 2/2005 | Chau et al. | |
| 6,885,055 B2 | 4/2005 | Lee | |
| 7,190,050 B2 | 3/2007 | King et al. | |

(Continued)

*Primary Examiner* — Meiya Li
(74) *Attorney, Agent, or Firm* — McClure, Qualey & Rodack, LLP (57) ABSTRACT

Methods for manufacturing semiconductor structures are provided. The method includes forming a first masking layer over a substrate and forming a second masking layer over the first masking layer. The method includes forming a photoresist pattern over the second masking layer and patterning the second masking layer through the photoresist pattern. The method further includes diminishing the photoresist pattern and patterning the second masking layer and the first masking layer through the diminished photoresist pattern. The method further includes removing the diminished photoresist pattern and patterning the semiconductor substrate through the second masking layer and the first masking layer to form a fin structure. The method further includes forming a gate structure over the fin structure.

20 Claims, 12 Drawing Sheets

(56) References Cited

U.S. PATENT DOCUMENTS

| | | |
|---|---|---|
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 2005/0001252 A1* | 1/2005 | Kim ................ H01L 21/823437 257/296 |
| 2005/0035391 A1* | 2/2005 | Lee ................... H01L 29/66795 257/308 |
| 2005/0133827 A1 | 6/2005 | Huang et al. |
| 2005/0145932 A1 | 7/2005 | Park et al. |
| 2005/0153490 A1 | 7/2005 | Yoon et al. |
| 2005/0170593 A1 | 8/2005 | Kang et al. |
| 2005/0170606 A1 | 8/2005 | Fu et al. |
| 2005/0224800 A1 | 10/2005 | Lindhert et al. |
| 2006/0081895 A1 | 4/2006 | Lee et al. |
| 2006/0275988 A1 | 12/2006 | Yagishita et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0134878 A1 | 6/2007 | Brask et al. |
| 2007/0148837 A1 | 6/2007 | Shah et al. |
| 2007/0161255 A1* | 7/2007 | Pau ................... H01L 21/32139 438/778 |
| 2007/0170509 A1* | 7/2007 | Izumida ................ H01L 29/785 257/353 |
| 2007/0224815 A1 | 9/2007 | Ban et al. |
| 2008/0081404 A1 | 4/2008 | Barna et al. |
| 2008/0102570 A1 | 5/2008 | Fischer et al. |
| 2008/0157201 A1 | 7/2008 | Marshall |
| 2008/0290470 A1 | 11/2008 | King et al. |
| 2008/0296632 A1 | 12/2008 | Moroz et al. |
| 2009/0181477 A1 | 7/2009 | King et al. |

* cited by examiner

METHOD FOR MANUFACTURING SEMICONDUCTOR STRUCTURE

CROSS REFERENCE TO RELATED APPLICATIONS

This application is a Divisional of application Ser. No. 14/582,576, filed on Dec. 24, 2014, now U.S. Pat. No. 10,483,397, the entirety of which is incorporated by reference herein. The application Ser. No. 14/582,576 is a Divisional of application Ser. No. 11/744,896, filed May 7, 2007, now U.S. Pat. No. 8,927,353, issued on Jan. 6, 2015, the entirety of which is incorporated by reference herein.

BACKGROUND OF THE INVENTION

Field of the Invention

The present invention relates generally to the field of semiconductor manufacturing and, more specifically, to a fin field effect transistor and method of forming the same.

Description of the Related Art

A fin field effect transistor (FinFET) such as a double gate MOSFET structure consists of a channel formed in a vertical silicon fin. FinFETs have found wide application as electronic devices for example, in digital processing applications. FinFETs, like other transistor devices, continue to be scaled to smaller and smaller dimensions in order to improve integrated circuit performance and cost. As the FinFET device is further miniaturized, device density will increase. It also becomes increasingly technically challenging to fabricate the FinFET features in the needed smaller dimensions.

The needed width of the fin structure is beyond the resolution limit or capabilities using the lithographic techniques currently available. Thus, fabrication methods different from the standard lithographic technique must be utilized. These techniques, which generally involve forming a larger silicon structure than desired for the final size, and then trimming the structure dimension through various means to the desired measure, have drawbacks that render them unacceptable. One such method of trimming oversize silicon fins involves an RIE (reactive ion etch) technique to trim down the silicon fin from its originally overdefined size. Thus, the technique is not viable for technology nodes going below that dimension. RIE is also an undesirable technique in that it generates fin structures with surface roughness. Surface roughness leads to poor electrical performance in the finished transistor.

U.S. Pat. No. 6,812,119 to Ahmed et al. discloses narrow fins by oxidation in double-gate FinFETs. The method of forming fins for a double-gate fin field effect transistor (FinFET) includes forming a second layer of semi-conducting material over a first layer of semi-conducting material and forming double caps in the second layer of semi-conducting material. The method further includes forming spacers adjacent sides of each of the double caps and forming double fins in the first layer of semi-conducting material beneath the double caps. The method also includes thinning the double fins to produce narrow double fins.

There are, however, still some problems regarding over-defined size or surface roughness.

BRIEF SUMMARY OF THE INVENTION

Therefore, there is a need to develop an improved fin field effect transistor and method of forming the same to prevent the above mentioned problems such as poor electrical performance resulting from surface roughness or high process complexity resulting from shrinking the overdefined size feature.

It is therefore an object of the invention to provide fin field effect transistors and methods of forming the same that can further improve electrical performance.

Another object of the invention is to reduce the process complexity of the fin field effect transistor.

Yet another object of the invention is to improve the manufacturing integration of the fin field effect transistor.

A fin field effect transistor and method of forming the same are provided. An embodiment of a fin field effect transistor comprises a semiconductor substrate having a fin structure and between two trenches with top portions and bottom portions. The fin field effect transistor further comprises shallow trench isolations formed in the bottom portions of the trenches and a gate electrode over the fin structure and the shallow trench isolation, wherein the gate electrode is substantially perpendicular to the fin structure. The fin field effect transistor further comprises a gate dielectric layer along sidewalls of the fin structure and source/drain electrode formed in the fin structure.

Another embodiment of a fin field effect transistor comprises a semiconductor substrate having a fin structure between two trenches with top portions and bottom portions. The fin field effect transistor further comprises shallow trench isolations formed in the bottom portions of the trenches. The fin field effect transistor further comprises a gate electrode over the fin structure and the shallow trench isolation. A top surface of the fin structure is separated from the gate electrode by a first distance. The fin field effect transistor further comprises a gate dielectric layer along sidewalls of the fin structure. Sidewalls of the fin structure are separated from the gate electrode by a second distance. The fin field effect transistor further comprises a source/drain electrode formed in the fin structure.

Yet another embodiment of a fin field effect transistor comprises a semiconductor substrate having a fin structure between two trenches with top portions and bottom portions. The fin field effect transistor further comprises shallow trench isolations formed in the bottom portions of the trenches. The fin field effect transistor further comprises a gate electrode over the fin structure and the shallow trench isolation. A top surface of the fin structure is separated from the gate electrode by a first oxide layer, and sidewalls of the fin structure are separated from the gate electrode by a second oxide layer. The fin field effect transistor further comprises a source/drain electrode formed in the fin structure.

An embodiment of a method of forming a fin field effect transistor is provided. First, a semiconductor substrate is provided. A first masking layer is formed overlying the semiconductor substrate. A second masking layer is formed overlying the first masking layer. A photoresist pattern with a first width is formed overlying the second masking layer. The second masking layer is etched while using the photoresist pattern as an etch mask. The photoresist pattern is trimmed to form a trimmed photoresist pattern with a second width smaller than the first width. The second masking layer and the first masking layer are etched while using the trimmed photoresist pattern as an etch mask to form a stacked mask comprising the first masking layer and the second masking layer. The semiconductor substrate is etched to form a fin structure between two trenches.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
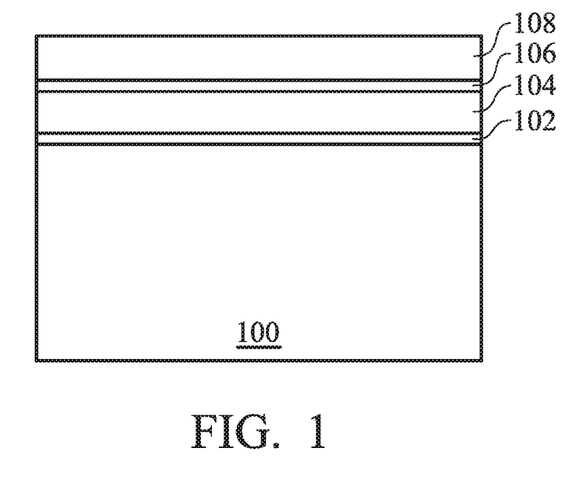
FIGS. 1-5, 6A, 6B, 7, 8, 9A, 9B, 10A, 10B, 11A and 11B are cross sections or perspective views showing an embodiment of the formation of a fin field effect transistor.

As shown in FIG. 1, a semiconductor substrate 100 such as a silicon substrate or a silicon/Germanium substrate is provided. A first oxide film 102 such as silicon oxide having a thickness of about 50 Å to 100 Å is optionally formed on the semiconductor substrate 100 by thermal oxidation. The first oxide film 102 may enhance adhesion between the semiconductor substrate 100 and first masking layer 104 formed in the following step.

A first masking layer 104 such as silicon nitride ($Si_3N_4$) is formed on the first oxide film 102 by chemical vapor deposition such as plasma enhanced chemical vapor deposition (PECVD), low pressure chemical vapor deposition (LPCVD) using dichlorosilane ($SiH_2Cl_2$) and ammonia ($NH_3$). Alternately, silicon nitride can be replaced by titanium nitride, silicon carbide or silicon oxycarbide. The first masking layer 104 has a thickness of about 300 Å to 500 Å, preferably about 400 Å.

A second oxide film 106 such as silicon oxide having a thickness of about 50 Å to 100A is optionally formed on the first masking layer 104 by plasma enhanced chemical vapor deposition (PECVD). The second oxide film 106 may enhance adhesion of the first masking layer 104 and the second masking layer 108 formed in the following step.

A second masking layer 108 such as silicon oxynitride (SiON) is formed on the second oxide film 106 by chemical vapor deposition (CVD) such as plasma enhanced chemical vapor deposition (PECVD), low pressure chemical vapor deposition (LPCVD) using silane ($SiH_4$), ammonia ($NH_3$) and nitrous nitride ($NO_2$). Alternately, silicon oxynitride can be replaced by titanium nitride, silicon carbide or silicon oxycarbide. The second masking layer 108 has a thickness of about 400 Å to 600 Å, preferably about 500 Å. The second masking layer 108 preferably comprises a different material from that of the first masking layer 104.

Figure 2:
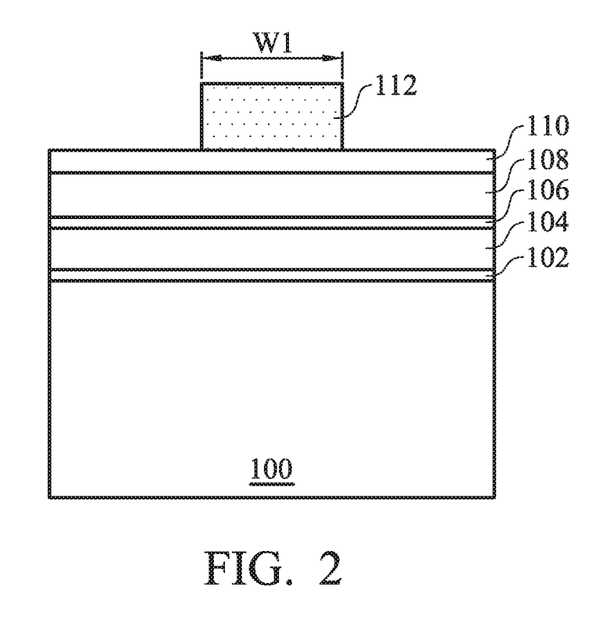
Figure 3:
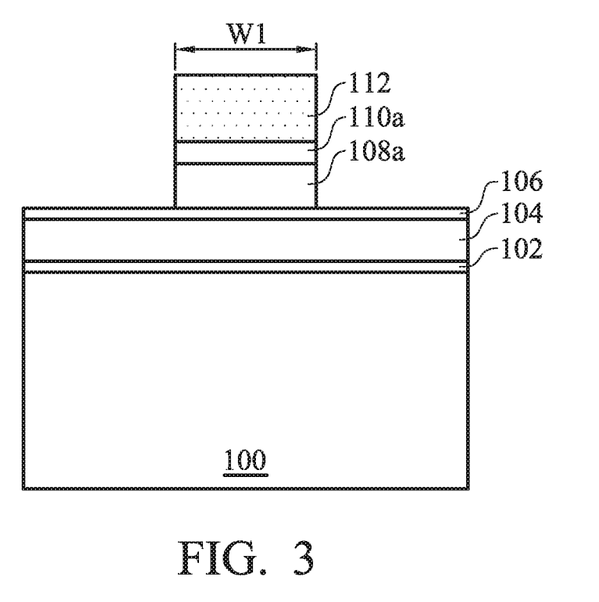

Referring to FIG. 2 and FIG. 3, to enhance control of critical dimension (CD) by suppressing standing wave effects and reflective notching caused by thin film interference, a bottom anti-reflective coating 110 is optionally formed on the second masking layer 108. The bottom anti-reflective coating 110 has a thickness of about 200 Å to 1500 Å. The bottom anti-reflective coating 110 can comprise a carbon-based organic material or inorganic material such as silicon oxime, silicon oxynitride, or silicon nitride. Alternately, an additional silicon oxide layer (not shown) may be further formed on the second masking layer 108 before forming the bottom anti-reflective coating 110. A photoresist pattern 112 having a first width W1 (500 Å to 3000 Å) is formed on the bottom anti-reflective coating 110 and over the second masking layer 108 by photolithography consisting of photoresist spin coating, soft baking, exposing, developing, and hard baking.

The bottom anti-reflective coating 110 and the second masking layer 108 are etched while using the photoresist pattern 112 as an etch mask to leave a bottom anti-reflective coating 110a and a second masking layer 108a until the second oxide film 106 is exposed. That is, second oxide film 106 serves as the etch stop layer during the etching process of the bottom anti-reflective coating 110 and the second masking layer 108. Next, referring to FIG. 4, photoresist pattern 112 is trimmed by laser trimming, etch trimming, thermal trimming or wet chemical immersion to form a trimmed photoresist pattern 112a with a second width W2 smaller than the first width W1, the thickness of the trimmed photoresist pattern 112a may also smaller than that of the photoresist pattern 112. The second width W2 is about 100 Å to 2000 Å, preferably 300 Å to 1000 Å. The bottom anti-reflective coating 110a, second masking layer 108a, the second oxide film 106, first masking layer 104, and the first oxide film 102 are etched while the trimmed photoresist pattern 112a is used as an etch mask so as to leave a stacked mask 120 including second masking layer 108b, second oxide film 106a, first masking layer 104a and first oxide film 102a.

Figure 4:
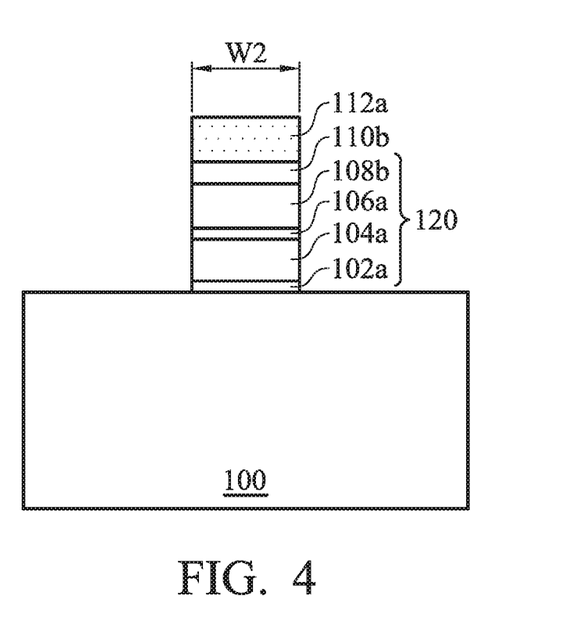

The exemplary process of etching the second masking layer 108 as shown in FIG. 3 followed by trimming the photoresist pattern 112 as shown in FIG. 4 is described above. Alternately, the second masking layer 108, the second oxide film 106, the first masking layer 104 and the first oxide film 102 are etched after the trimmed photoresist pattern 112a is formed.

Figure 5:
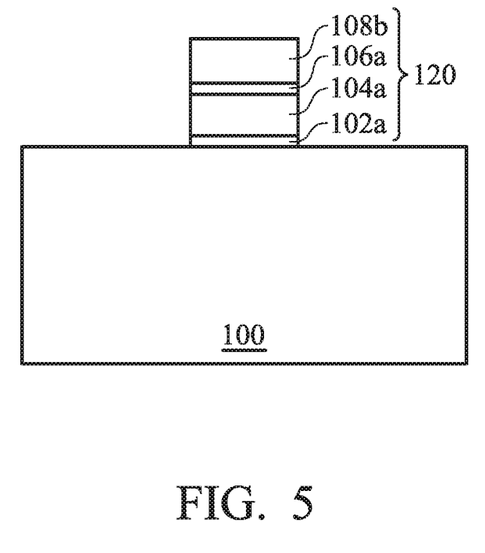
Figure 6A:
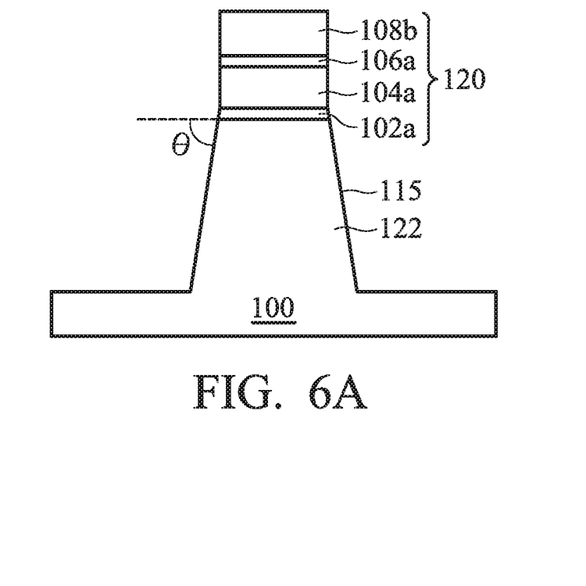
Figure 6B:
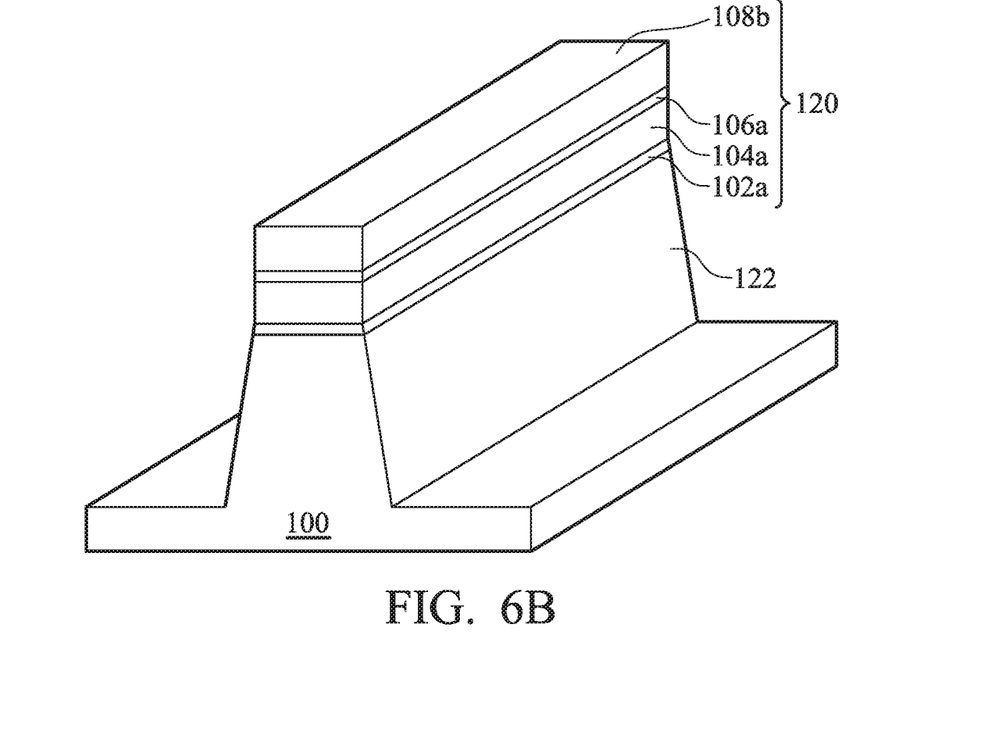

As shown in FIG. 4 and FIG. 5, the trimmed photoresist pattern 112a and the bottom anti-reflective coating 110b are removed by etching or ashing containing oxygen plasma until semiconductor substrate 100 is exposed. Then, the semiconductor substrate 100 is etched by a transformer coupled plasma (TCP) etcher, or a capacitive coupling plasma (CCP) etcher, a microwave down stream etcher using $Cl_2$, HBr, and/or $SF_6$ to leave a fin structure 122 between trenches 115 as shown in FIG. 6A and FIG. 6B. The fin structure 122 has a desirable width or dimension because the pattern of the stacked mask 120 having a width similar to the width W2 of the trimmed photoresist pattern 112a. Therefore, the fin field effect transistor has a narrower dimension without trimming the fin structure 122 down from its originally overdefined size. Thus, the process complexity of the fin field effect transistor can be simplified. Furthermore, over-etching of the fin structure may be prevented. Also, the electrical performance resulting from surface roughness may be prevented.

The fin structure 122 is tapered toward the stacked mask 120. Preferably, the included angle θ of the upper surface and the sidewall of the fin structure 122 is about 83° to 89°.

Figure 7:
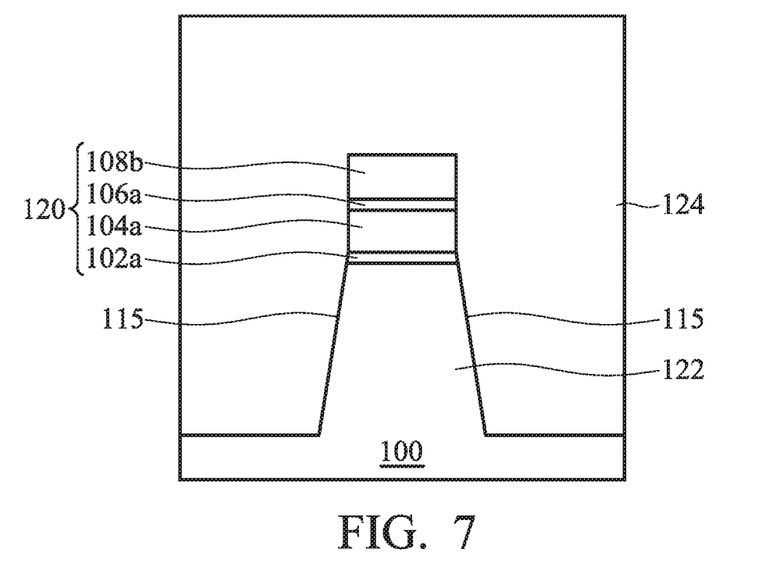

As shown in FIG. 7, an isolation layer 124, for example silicon oxide, is deposited over the semiconductor substrate 100 and the stacked mask 120 filling in the trenches 115 by high density plasma chemical vapor deposition (HDPCVD) using $SiH_4$ and $N_2O$.

Figure 8:
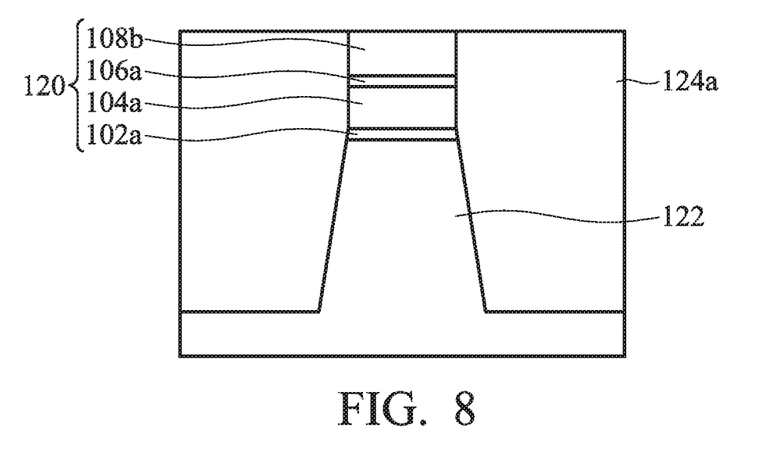
Figure 9A:
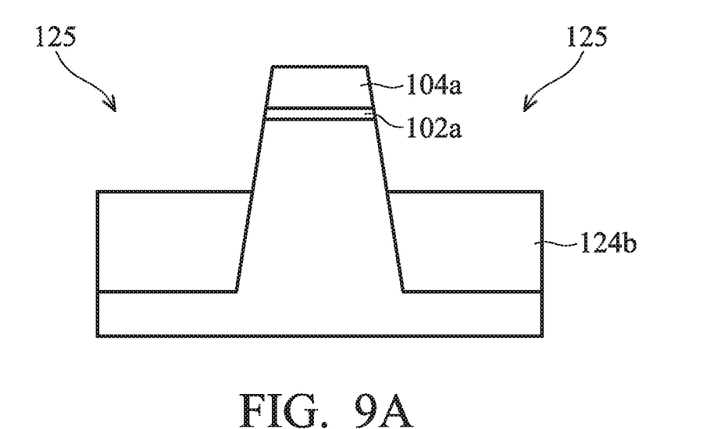
Figure 9B:
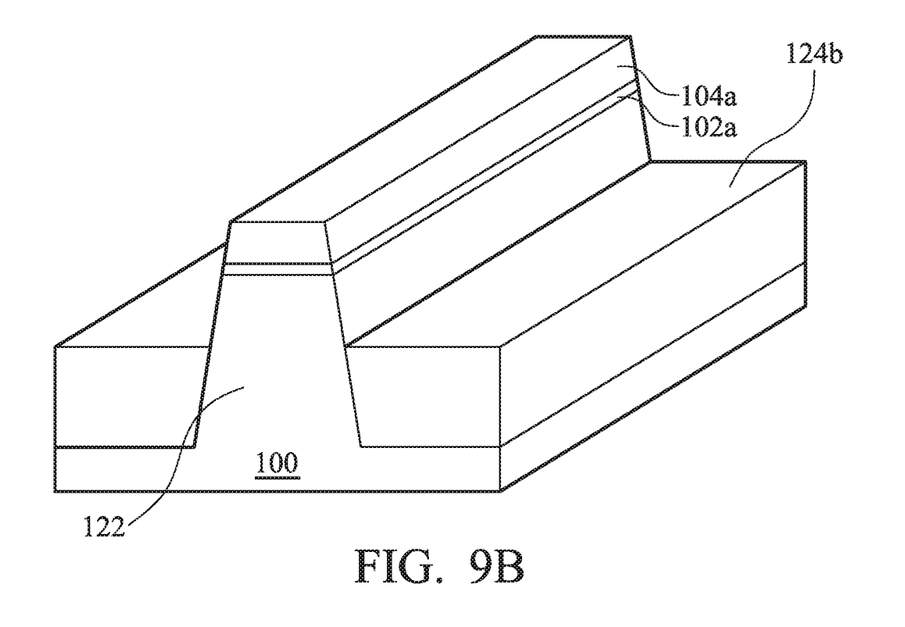
Figure 9C:
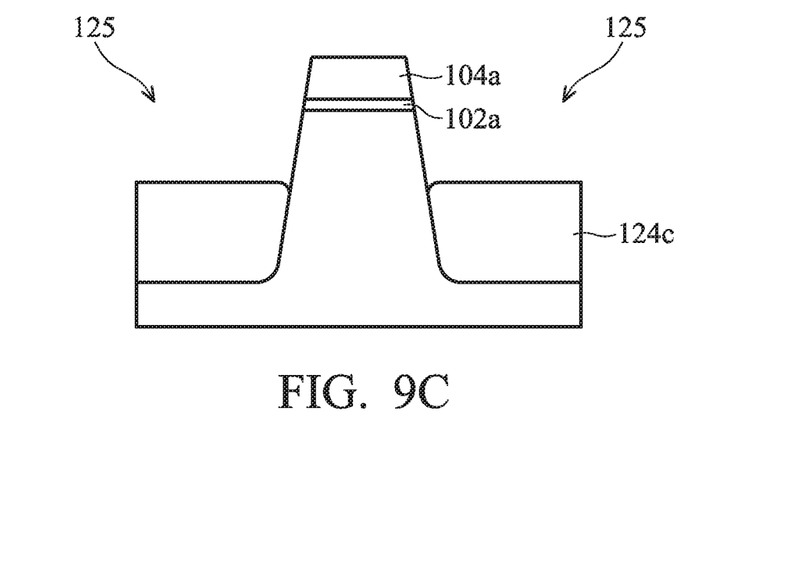
FIG. 9C and FIG. 9D are cross sections or perspective views showing an embodiment of the formation of a fin field effect transistor after performing the stage shown in FIGS. 9A and 9B.
Figure 9D:
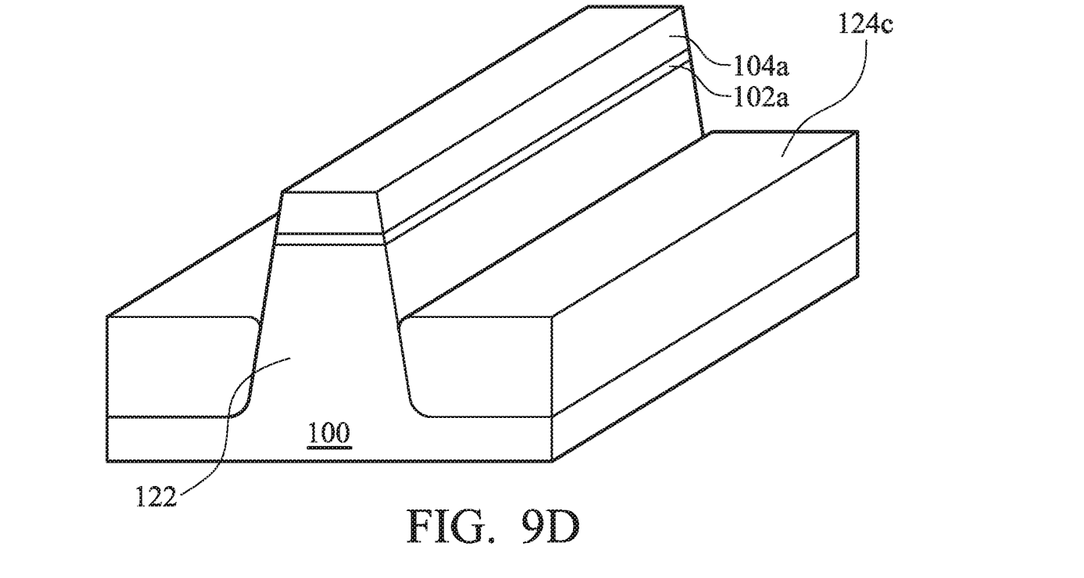

Referring now to FIG. 8, the isolation layer 124 is planarized by chemical mechanical polishing (CMP) while the stacked mask 120 is used as a polish stop layer to leave an intermediate isolation layer 124a. Next, as shown in FIG. 9A and FIG. 9B, the intermediate isolation layer 124a is recessed or partially removed to form shallow trench isolations 124b and recesses 125 above the shallow trench isolations 124b so that the top portion of fin structure 122 is exposed. The recesses 125 may have depths of about 500 Å to 3000 Å. The second masking layer 108b and the second oxide film 106a are then removed by dry or wet etching. Optionally, as shown in FIG. 9C and FIG. 9D, the semiconductor substrate 100 with shallow trench isolation 124c is subjected annealing at a high temperature of about 700° C.~1000° C. so that the shallow trench isolation 124c has a rounded top corner and/or a rounded bottom corner. Alternately, a part of the stacked mask 120 may be removed in the step of chemical mechanical polishing of isolation layer 124. That is, the second masking layer 108b and the second oxide film 106a are simultaneously polished away while the first masking layer 104a is used as the polish stop layer.

Figure 10A:
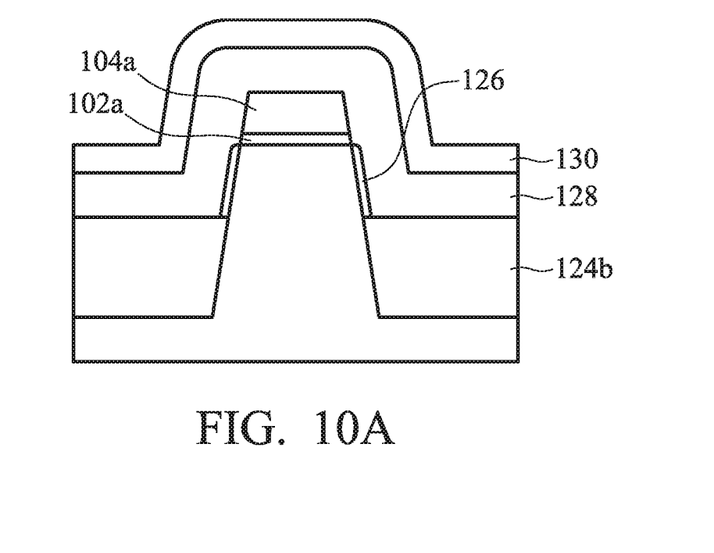
Figure 10B:
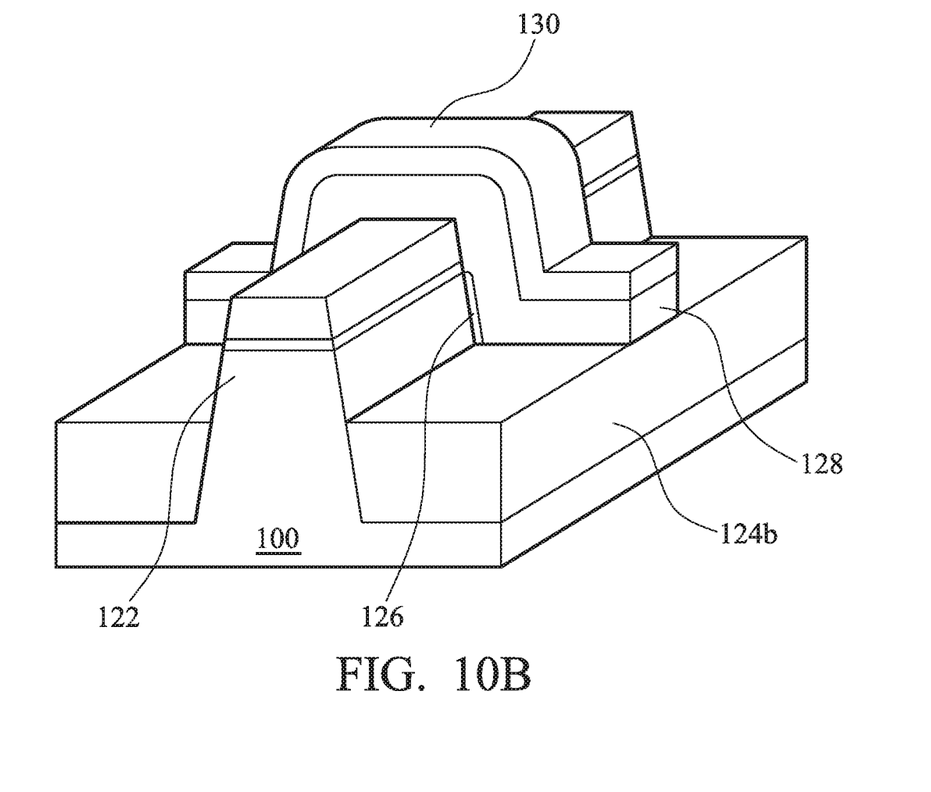

Next, as shown in FIG. 10A and FIG. 10B, a gate dielectric layer 126 such as silicon oxide is formed along the sidewalls of top portion the fin structure 122 by thermal oxidation. Alternately, the gate dielectric layer 126 may comprise aluminum oxide, lanthanum aluminum oxide, hafnium oxynitride, silicon oxynitride, zirconium oxide, hafnium oxide, lanthanum oxide, yttrium oxide or silicon oxide. The gate dielectric layer 126 may be formed by chemical vapor deposition and may be a single layer, a double layer or a composite layer. The gate dielectric layer 126 may have a thickness of about 50 Å to 200 Å, preferably 50 Å to 100 Å.

Then, a conductive layer such as a metal layer is deposited by physical vapor deposition, such as sputtering using a metal target. A hard mask 130 comprising a different material from the first masking layer 104a is formed on the conductive layer by a masking layer deposition, photolithography and etching. In one embodiment of the invention, hard mask 130 may comprise silicon oxynitride. The hard mask 130 is substantially perpendicular to the fin structure 122. The conductive layer is etched while the hard mask 130 is used as an etch stop layer to form a gate electrode 128. Therefore, the gate electrode 128 is substantially perpendicular to the stacked mask 102a and 104a. The gate electrode 128 may comprise titanium, tantalum, molybdenum, ruthenium, tungsten or platinum or an alloy thereof or titanium nitride, tantalum nitride, molybdenum nitride, tungsten nitride, titanium silicide, tantalum silicide, molybdenum silicide, tungsten silicide, indium oxide, tin oxide, or ruthenium oxide.

Figure 11A:
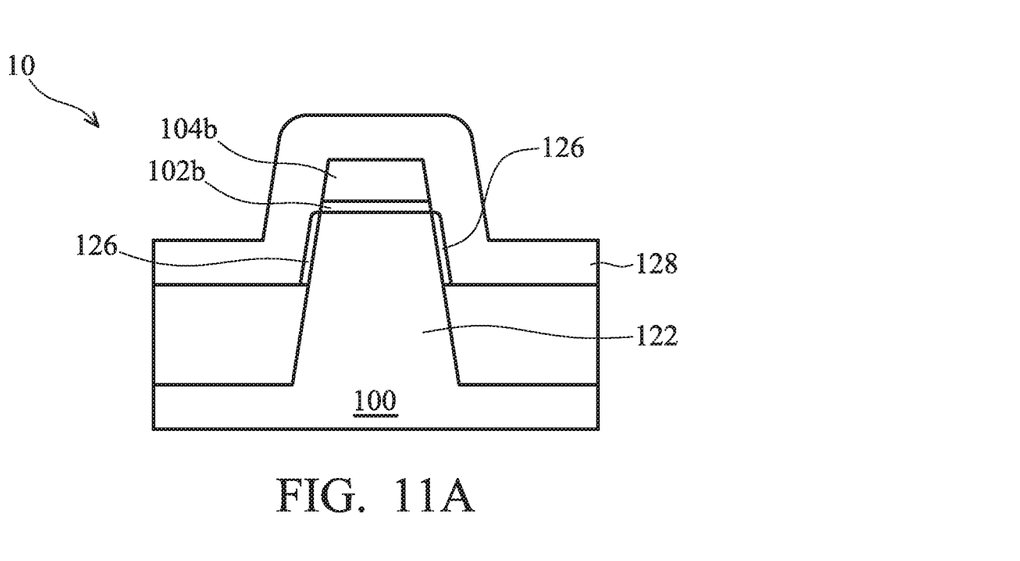
Figure 11B:
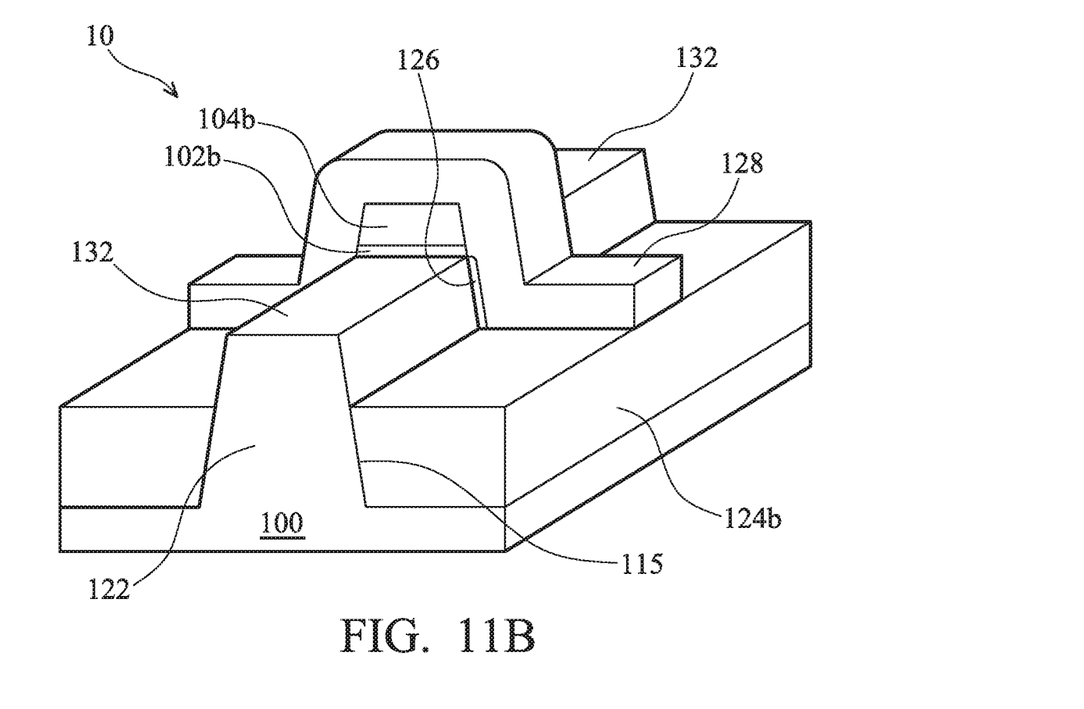
Figure 11C:
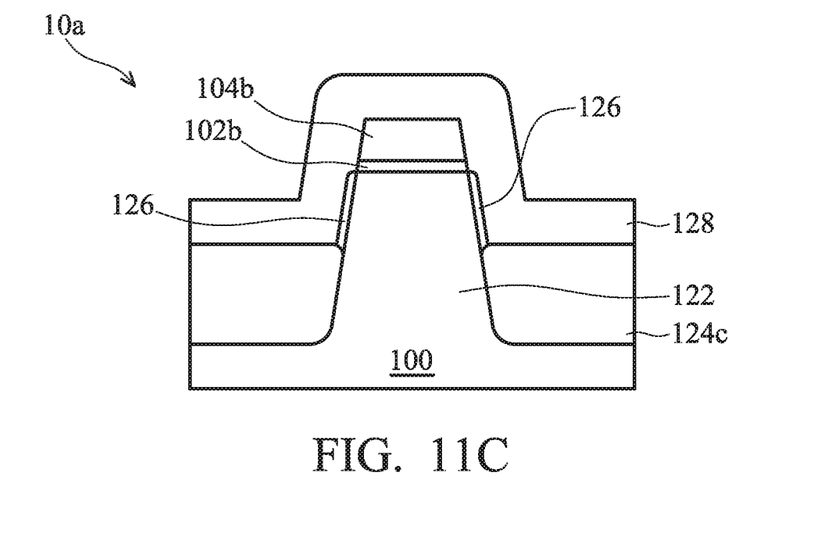
FIGS. 11C, 11D, 12A, 12B, 13A and 13B are cross sections or perspective views showing another embodiment of the formation of a fin field effect transistor.
Figure 11D:
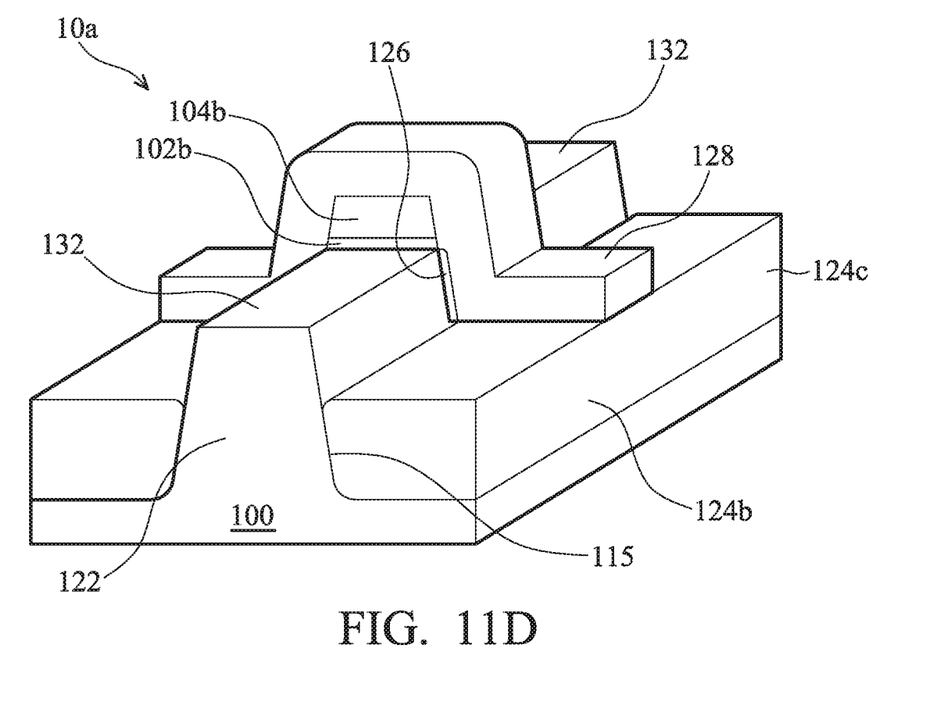
Figure 12A:
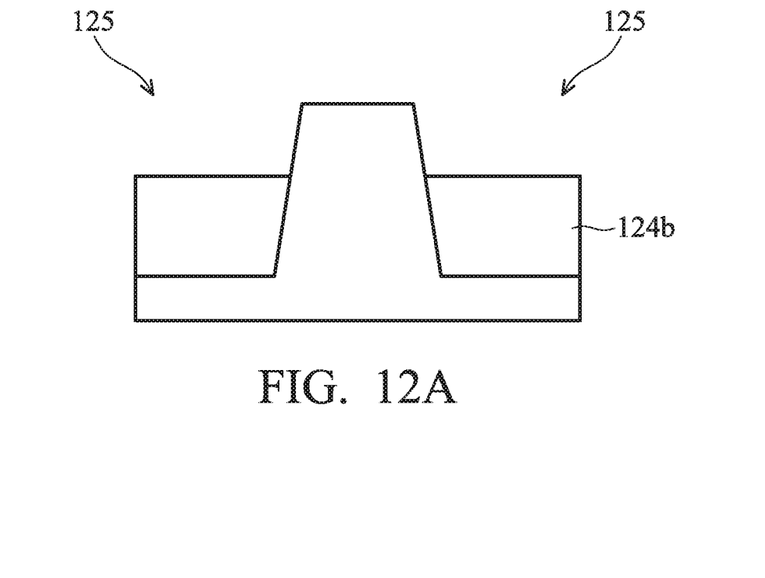
Figure 12B:
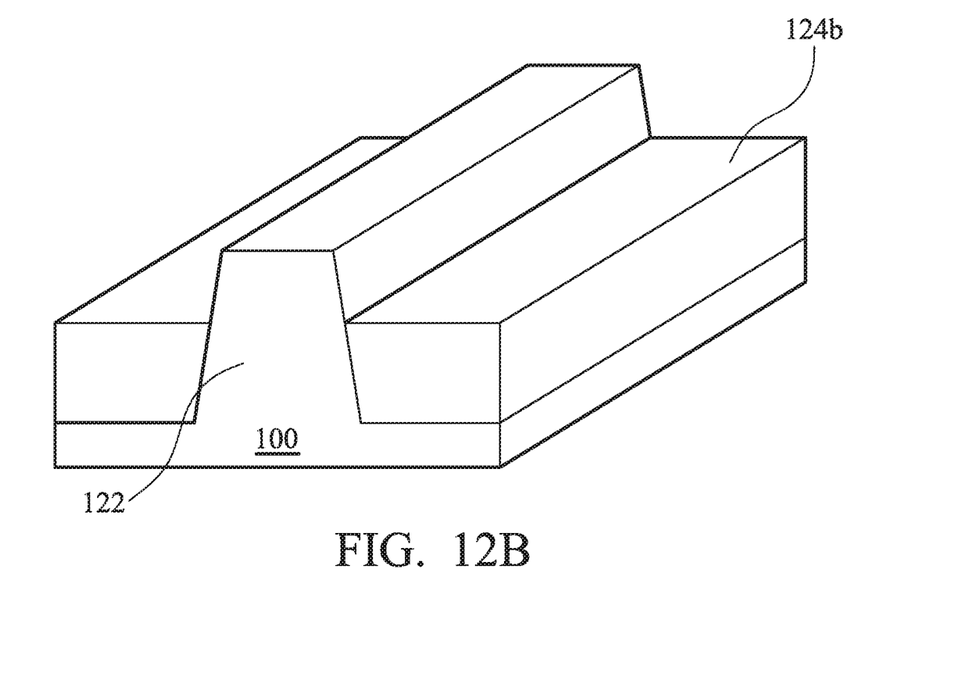
Figure 13A:
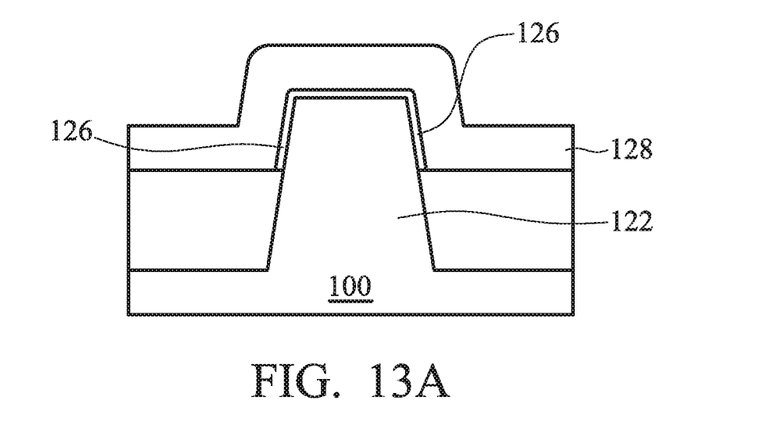
Figure 13B:
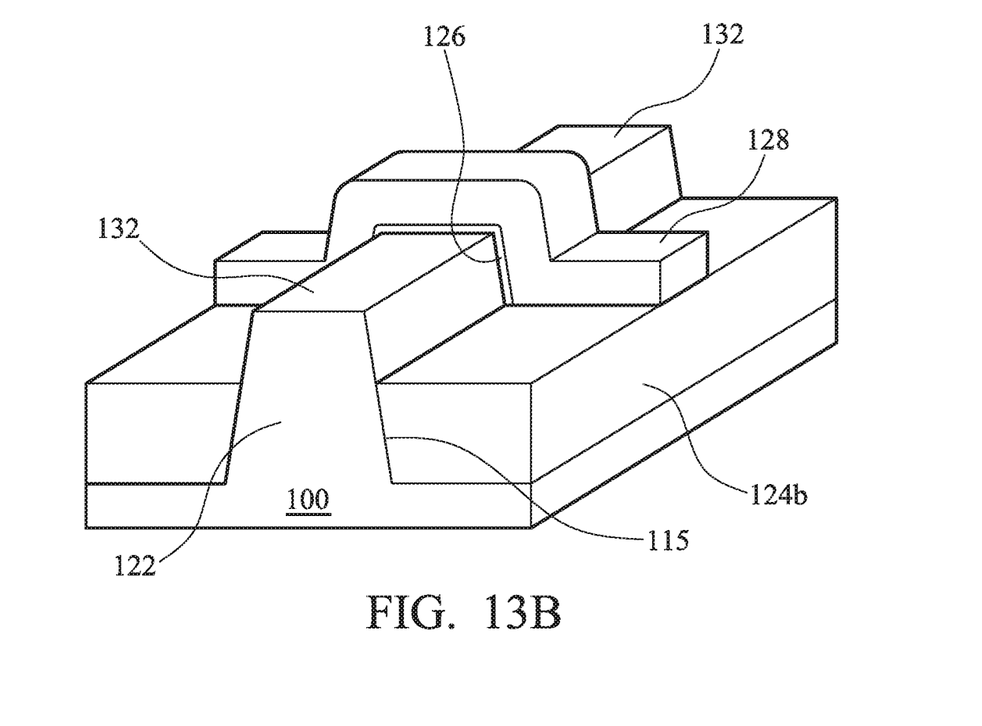

Referring to FIG. 11A and FIG. 11B, the first masking layer 104b and the first oxide film 102a are removed until the upper surface of the fin structure 122 is exposed while the hard mask 130 is used as a mask to leave a first masking layer 104b and a first oxide film 102b under the gate electrode 128. Next, the hard mask 130 is removed by reactive ion etching or wet etching. Ions or impurities are implanted in the top portion of the fin structure 122 to form a source/drain doped region 132 from the upper surface thereof thus a fin field effect transistor 10 is generated. Optionally, as shown in FIG. 11C and FIG. 11D, a fin field effect transistor 10a is similar to the fin field effect transistor 10 except that the fin field effect transistor 10a includes a shallow trench isolation 124c having a rounded top corner and/or a rounded bottom corner formed by the processes related to FIG. 9C and FIG. 9D.

The fin field effect transistor 10 comprises a semiconductor substrate 100 having a fin structure 122 between two trenches 115 with top portions and bottom portions and shallow trench isolations 124b formed in the bottom portions of the trenches 115. The fin field effect transistor 10 further comprises a gate electrode 128 over the fin structure 122 and the shallow trench isolation 124b, wherein the gate electrode 128 is substantially perpendicular to the fin structure 122. The fin field effect transistor 10 further comprises a gate dielectric layer 126 along sidewalls of the top portion of the fin structure 122 and source/drain doped region 132, source/drain electrode, formed in the top portion of the fin structure 122. The fin field effect transistor 10 may comprise a mask layer consisting of first masking layer 104a and first oxide film 102b between the fin structure 122 and the gate electrode 128. Because a part of the stacked mask 120 is removed before recessing the isolation layer 124, the mask layer has a relatively smaller thickness thus topography may be reduced. The fin structure 122 may have a thickness of about 100 Å to 1000 Å. The top portions of the trenches 115 may have a depth of about 500 Å to 3000 Å. The fin structure 122 is tapered toward the top portion thereof. Preferably, the included angle of the upper surface and the sidewall of the fin structure 122 is about 83° to 89°.

FIGS. 12A, 12B, 13A and 13B are cross sections or perspective views showing another embodiment of the formation of a fin field effect transistor. The exemplary process as shown in FIGS. 12a to 13b is substantially similar to that as shown in FIGS. 9A to 11B except that the first oxide film 102a and first masking layer 104a are removed to expose the top surface of the fin structure 122 before forming the gate dielectric layer 126. Thus, the gate dielectric layer 126 is formed along the sidewalls and the top surface of the fin structure 122.

According to the exemplary processes of the fin field effect transistor mentioned above, the first masking layer 104 used for the shallow trench isolation polish stop layer and the second oxide film 106 for transferring the trimmed photoresist pattern are different materials, thus manufacturing integration can be improved.

In some embodiments, a method for manufacturing a semiconductor structure is provided. The method for manufacturing the semiconductor structure includes forming a first masking layer over a substrate and forming a second masking layer over the first masking layer. The method for manufacturing the semiconductor structure includes forming a photoresist pattern over the second masking layer and patterning the second masking layer through the photoresist pattern. The method for manufacturing the semiconductor structure further includes diminishing the photoresist pattern and patterning the second masking layer and the first masking layer through the diminished photoresist pattern. The method for manufacturing the semiconductor structure further includes removing the diminished photoresist pattern and patterning the semiconductor substrate through the second masking layer and the first masking layer to form a fin structure. The method for manufacturing the semiconductor structure further includes forming a gate structure over the fin structure.

In some embodiments, a method for manufacturing a semiconductor structure is provided. The method for manufacturing the semiconductor structure includes forming a masking layer over a substrate and forming a photoresist pattern over the masking layer. The method for manufacturing the semiconductor structure includes patterning the masking layer through the photoresist pattern and treating the photoresist pattern to diminish a width of the photoresist pattern. The method for manufacturing the semiconductor structure further includes patterning the masking layer through the photoresist pattern and removing the photoresist pattern. The method for manufacturing the semiconductor structure further includes etching the semiconductor substrate through the masking layer to form a fin structure and forming an isolation structure around the fin structure. The method for manufacturing the semiconductor structure further includes forming a gate structure across the fin structure.

In some embodiments, a method for manufacturing a semiconductor structure is provided. The method for manufacturing the semiconductor structure includes forming a first oxide layer over a substrate and forming a first masking layer over the first oxide layer. The method for manufacturing the semiconductor structure includes forming a second masking layer over the first masking layer and forming a photoresist pattern over the second masking layer. The method for manufacturing the semiconductor structure further includes patterning the second masking layer through the photoresist pattern and performing a trimming process to the photoresist pattern so that a width of the photoresist pattern before the trimming process is greater than a width of the photoresist pattern after the trimming process. The method for manufacturing the semiconductor structure further includes patterning the second masking layer, the first masking layer, and the first oxide layer through the photoresist pattern after performing the trimming process and patterning the semiconductor substrate through the second masking layer and the first masking layer to form a fin structure. The method for manufacturing the semiconductor structure further includes forming a gate structure over the fin structure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a semiconductor structure, comprising:
    forming a first masking layer over a substrate;
    forming a second masking layer over the first masking layer;
    forming an anti-reflective coating over the second masking layer;
    forming a photoresist pattern over the anti-reflective coating;
    patterning the anti-reflective coating and the second masking layer through the photoresist pattern;
    diminishing the photoresist pattern;
    patterning the second masking layer and the first masking layer through the diminished photoresist pattern;
    removing the diminished photoresist pattern and the anti-reflective coating;
    patterning the substrate through the second masking layer and the first masking layer to form a fin structure; and
    forming a gate structure over the fin structure.

2. The method for manufacturing the semiconductor structure as claimed in claim 1, further comprising:
    forming an isolation structure around the fin structure, wherein the isolation structure has a convex top corner at a sidewall of the fin structure.

3. The method for manufacturing the semiconductor structure as claimed in claim 2, wherein the gate structure has a tip portion extending into a space between the sidewall of the fin structure and the convex top corner of the isolation structure.

4. The method for manufacturing the semiconductor structure as claimed in claim 2, wherein the gate structure comprises a gate dielectric layer and a gate electrode layer, and an entirety of the gate dielectric layer is disposed at a level between a top surface of the fin structure and the convex top corner of the isolation structure.

5. The method for manufacturing the semiconductor structure as claimed in claim 1, further comprising:
    removing the second masking layer before forming the gate structure over the fin structure.

6. The method for manufacturing the semiconductor structure as claimed in claim 1, wherein the first masking layer is surrounded by the gate structure.

7. The method for manufacturing the semiconductor structure as claimed in claim 1, further comprising:
    removing the first masking layer exposed by the gate structure.

8. A method for manufacturing a semiconductor structure, comprising:
    forming a first masking layer over a substrate;
    forming a second masking layer over the first masking layer;
    forming an anti-reflective coating over the second masking layer;
    forming a photoresist pattern over the anti-reflective coating;
    patterning the anti-reflective coating and the second masking layer through the photoresist pattern;
    treating the photoresist pattern to diminish a width of the photoresist pattern;
    patterning the anti-reflective layer, the second masking layer, and the first masking layer through the diminished photoresist pattern;
    removing the diminished photoresist pattern and the anti-reflective coating after patterning the anti-reflective layer, the second masking layer, and the first masking layer through the diminished photoresist pattern;
    etching the substrate through the the first masking layer and the second masking layer after removing the diminished photoresist pattern and the anti-reflective coating to form a tin structure;
    forming an isolation structure around the tin structure; and
    forming a gate structure across the fin structure.

9. The method for manufacturing the semiconductor structure as claimed in claim 8, wherein forming the gate structure across the fin structure further comprising:
    forming a gate dielectric layer along sidewalls of a top portion of the fin structure;
    forming a gate electrode layer over the gate dielectric layer,
    wherein an entirety of the gate dielectric layer is disposed at a level between a top surface of the fin structure and a top surface of the isolation structure.

10. The method for manufacturing the semiconductor structure as claimed in claim 8, further comprising:
    forming an oxide layer over the substrate such that the second masking layer is formed over the oxide layer; and
    patterning the oxide layer through the diminished photoresist pattern, wherein the gate structure covers the oxide layer.

11. The method for manufacturing the semiconductor structure as claimed in claim 10, further comprising:
removing the oxide layer not covered by the gate structure.

12. The method for manufacturing the semiconductor structure as claimed in claim 8, further comprising:
removing the second masking layer before forming the gate structure over the fin structure.

13. A method for manufacturing a semiconductor structure, comprising:
forming a first oxide layer over a substrate;
forming a first masking layer over the first oxide layer;
forming a second masking layer over the first masking layer;
forming a photoresist pattern over the second masking layer;
patterning the second masking layer through the photoresist pattern;
performing a trimming process to the photoresist pattern so that a width of the photoresist pattern before the trimming process is greater than a width of the photoresist pattern after the trimming process;
patterning the second masking layer, the first masking layer, and the first oxide layer through the photoresist pattern after performing the trimming process;
patterning the substrate through the second masking layer and the first masking layer to form a fin structure;
forming an isolation layer around the fin structure;
removing the second masking layer after forming the isolation layer; and
forming a gate structure over the fin structure.

14. The method for manufacturing the semiconductor structure as claimed in claim 13, further comprising:
removing the photoresist pattern before patterning the substrate; and
removing the second masking layer before forming the gate structure over the fin structure.

15. The method for manufacturing the semiconductor structure as claimed in claim 13, wherein forming the gate structure over the fin structure further comprising:
forming a gate dielectric layer along sidewalls of a top portion of the fin structure, and
forming a gate electrode layer over the gate dielectric layer,
wherein the first oxide layer and the first masking layer is covered by the gate electrode layer.

16. The method for manufacturing the semiconductor structure as claimed in claim 15, further comprising
forming a third mask layer over the gate electrode layer; and
patterning the gate electrode layer to form the gate structure.

17. The method for manufacturing the semiconductor structure as claimed in claim 16, further comprising:
removing the first oxide layer and the first masking layer not covered by the third masking layer.

18. The method for manufacturing the semiconductor structure as claimed in claim 17, further comprising:
recessing the isolation layer to form an isolation structure around the fin structure,
wherein the isolation structure has a convex top corner at a sidewall of the fin structure.

19. The method for manufacturing the semiconductor structure as claimed in claim 18, wherein an entirety of the gate dielectric layer is disposed at a level between a top surface of the fin structure and the convex top corner of the isolation structure.

20. The method for manufacturing the semiconductor structure as claimed in claim 19, wherein the first oxide layer directly covers the top surface of the fin structure and the gate dielectric layer directly covers the sidewall of the fin structure.

* * * * *